US011447725B2

(12) United States Patent
Shellef (10) Patent No.: US 11,447,725 B2
(45) Date of Patent: *Sep. 20, 2022

(54) COMPOSITIONS COMPRISING TRANS-1,2-DICHLOROETHYLENE AND AN ORGANIC COMPOUND, AND METHODS OF USING THE SAME

(71) Applicant: SHELLEF HOLDINGS INC., Kingston, NY (US)

(72) Inventor: Dov Shellef, Kingston, NY (US)

(73) Assignee: SHELLEF HOLDINGS INC., Kingston, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 17/161,938

(22) Filed: Jan. 29, 2021

(65) Prior Publication Data

US 2021/0147766 A1    May 20, 2021

Related U.S. Application Data

(63) Continuation of application No. 16/266,422, filed on Feb. 4, 2019, now Pat. No. 10,934,507.

(Continued)

(51) Int. Cl.
*C11D 3/18* (2006.01)
*C11D 3/43* (2006.01)
(Continued)

(52) U.S. Cl.
CPC ............. *C11D 7/5086* (2013.01); *B08B 3/00* (2013.01); *C08J 9/149* (2013.01); *C09D 7/20* (2018.01);
(Continued)

(58) Field of Classification Search
CPC ....... C11D 3/18; C11D 3/2006; C11D 3/2041; C11D 3/2068; C11D 3/2072; C11D 3/245;
(Continued)

(56) References Cited

U.S. PATENT DOCUMENTS 9,873,856 B1    1/2018  Amundsen
10,934,507 B2*  3/2021  Shellef ................. C11D 7/5072
(Continued)

FOREIGN PATENT DOCUMENTS

WO    03/104365 A2    12/2003

OTHER PUBLICATIONS

Apr. 4, 2019 International Search Report issued in International Application No. PCT/US2019/016513.
(Continued)

*Primary Examiner* — Brian P Mruk
(74) *Attorney, Agent, or Firm* — Cantor Colburn LLP (57) ABSTRACT

Disclosed herein are a solvent composition and methods of using the solvent composition. The solvent composition includes at least 80 wt. % of trans-1,2-dichloroetheylene (t-DCE), and 0.1 to 20 wt. % of at least one organic compound. The organic compound may be a hydrocarbon and/or an oxygenated solvent. The solvent composition may be used to clean a surface by contacting the surface with the composition to dissolve a contaminant on the surface. The composition may be used to remove a coating from a surface of a substrate by contacting the surface with the solvent composition to dissolve the coating and removing the composition containing the coating from the surface. The composition may also be used to deposit material on a substrate by dissolving the material in the solvent composition, applying the composition containing the material onto the substrate, and evaporating the composition from the substrate.

19 Claims, 5 Drawing Sheets

Related U.S. Application Data (60) Provisional application No. 62/625,521, filed on Feb. 2, 2018.

(51) Int. Cl.

| | | |
|---|---|---|
| *C11D 7/24* | (2006.01) | |
| *C11D 7/26* | (2006.01) | |
| *C11D 7/30* | (2006.01) | |
| *C11D 7/50* | (2006.01) | |
| *B08B 3/04* | (2006.01) | |
| *C09D 7/20* | (2018.01) | |
| *B08B 3/00* | (2006.01) | |
| *C08J 9/14* | (2006.01) | |
| *C09D 9/00* | (2006.01) | |
| *C11D 11/00* | (2006.01) | |
| *C23G 5/028* | (2006.01) | |
| *D06L 1/02* | (2006.01) | |
| *H01L 21/02* | (2006.01) | |
| *H05K 3/26* | (2006.01) | |

(52) U.S. Cl.
CPC ............... *C09D 9/005* (2013.01); *C11D 7/24* (2013.01); *C11D 7/26* (2013.01); *C11D 7/30* (2013.01); *C11D 7/5018* (2013.01); *C11D 7/5036* (2013.01); *C11D 7/5068* (2013.01); *C11D 7/5072* (2013.01); *C11D 7/5081* (2013.01); *C11D 11/0017* (2013.01); *C11D 11/0023* (2013.01); *C11D 11/0047* (2013.01); *C23G 5/02806* (2013.01); *D06L 1/02* (2013.01); *C08J 2203/12* (2013.01); *C08J 2203/14* (2013.01); *C08J 2203/162* (2013.01); *C08J 2203/182* (2013.01); *H01L 21/02057* (2013.01); *H05K 3/26* (2013.01)

(58) Field of Classification Search
CPC .... C11D 3/43; C11D 7/24; C11D 7/26; C11D 7/263; C11D 7/264; C11D 7/30; C11D 7/50; C11D 7/5031; C11D 7/5068; C11D 7/5072; C11D 7/5077; B08B 3/04
See application file for complete search history.

(56) References Cited

U.S. PATENT DOCUMENTS

| | | | |
|---|---|---|---|
| 11,124,744 B2* | 9/2021 | Shellef | ............... C09K 5/04 |
| 2007/0032394 A1* | 2/2007 | Lallier | ............ C23G 5/02883 |
| | | | 510/175 |
| 2015/0329806 A1* | 11/2015 | Robin | ............... C11D 7/5063 |
| | | | 134/6 |
| 2016/0115428 A1 | 4/2016 | Shellef et al. | |

OTHER PUBLICATIONS

Apr. 4, 2019 Written Opinion issued in International Application No. PCT/US2019/016513.
Jan. 31, 2020 Office Action issued in U.S. Appl. No. 16/266,422.
Jul. 27, 2020 Office Action Issued in U.S. Appl. No. 16/266,422.
Nov. 9, 2020 U.S. Notice of Allowance issued in U.S. Appl. No. 16/266,422.

* cited by examiner

COMPOSITIONS COMPRISING TRANS-1,2-DICHLOROETHYLENE AND AN ORGANIC COMPOUND, AND METHODS OF USING THE SAME

This application is a continuation of application Ser. No. 16/266,422, filed Feb. 4, 2019, which issued as U.S. Pat. No. 10,934,507, and which in turn claims the benefit of U.S. Provisional Application No. 62/625,521, filed Feb. 2, 2018.

BACKGROUND

Solvent cleaning is used throughout a wide range of industries, including, for example, automotive, aerospace, jewelry and watchmaking, medical device, semiconductor, and telecommunications and data processing industries, as well as any industry that employs electronics and/or circuit boards. Cleaning of products and parts to remove contaminants, such as waxes, greases, oils, and solder flux residues, is an integral part of many manufacturing, maintenance, and refurbishing operations. Many articles or components are treated with oil or other processing agents during the fabrication process and it is frequently required that the oil and any other contaminants be removed before the article is ready for use or sale, or before the component is installed into the finished product. Additionally, contaminants, such as excess rosin flux, must often be removed from electronic or electrical components or devices, such as circuit boards, before they are acceptable for use because the presence of such contaminants could interfere with the performance of the electrical or electronic components and could also damage the components. Solvent cleaning processes, such as vapor degreasing and wet cleaning, can be used to remove contaminants from such articles and parts.

Cleaning solvents should have low toxicity and be safe to use, and should have a high solvency power. Trans-1,2-dichloroethylene (t-DCE) is a chlorinated solvent with a boiling point of 48° C. that has exceptional cleaning power. For example, t-DCE has very good solubilizing power, especially for fatty substances, such as lubricants, oils, and fats. However, t-DCE is considered to be a flammable liquid with a flash point of about 2° C. (36° F.).

Prior methods to reduce or eliminate flammability of t-DCE have focused on mixing t-DCE with a nonflammable compound to form an azeotrope or azeotrope-like composition. The nonflammable compounds were produced, for example, by attaching a halogen, such as chlorine, fluorine, or bromine, to a hydrocarbon backbone to reduce flammability. For example, the nonflammable compounds included halogenated solvents, including fluorinated, chlorinated, and/or brominated hydrocarbons, such as chlorofluorocarbons (CFC's), hydrochlorofluorocarbons (HCFC's), hydrofluorocarbons (HFC's), hydrofluoroethers (HFE's), n-propyl bromide, and the like. However, many formulations that exhibit lower flammability or are nonflammable do not have sufficiently aggressive cleaning characteristics, and as a result are not very practical for use in cleaning applications. Additionally, such halogenated solvents are expensive and significantly increase the cost of production.

Additionally, the use of CFC's, HCFC's, and HFC's has become disfavored because of their environmental impact. CFC's and HCFC's have ozone depletion characteristics and nonflammable HFC's are considered "super greenhouse" gases with high global warming potentials. Many HFC's and HFE's exhibit properties that are not optimal for safe cleaning. For example, difluoroethane (HFC-152a) and 1,1,1-trifluoropropene (HFO-1243zf) are both highly flammable and both exhibit very low boiling points. Because of these properties, azeotropes and azeotrope-like compositions containing these compounds are disfavored for use in many cleaning applications, for example, where there is a concern of fire or explosion hazards.

A need thus exists for solvent compositions that not only have sufficiently aggressive cleaning characteristics and high solvency power, but are also characterized by low toxicity, zero ozone depletion potential, low global warming potential, and preferably have reduced flammability or are nonflammable.

SUMMARY

Disclosed herein are a solvent composition and methods of using the solvent composition. The methods include, for example, a method of cleaning a surface, a method for removing a coating from a surface, and a method for depositing a material on a substrate.

The solvent composition includes at least 80 wt. % of t-DCE, and 0.1 to 20 wt. % of at least one organic compound. The organic compound may be a hydrocarbon and/or an oxygenated solvent. The solvent compositions are characterized by high solvency power, low toxicity, zero ozone depletion potential, and low global warming potential. In some embodiments, the solvent composition may be nonflammable.

The solvent composition may be used to clean a surface by contacting the surface with the composition to dissolve a contaminant on the surface. The composition may be used to remove a coating from a surface of a substrate by contacting the surface with the solvent composition to dissolve the coating and removing the composition containing the coating from the surface. The composition may also be used to deposit material on a substrate by dissolving the material in the solvent composition, applying the composition containing the material onto the substrate, and evaporating the composition from the substrate. The composition may also be employed in drycleaning, heat transfer, and foam blowing applications.

DETAILED DESCRIPTION

Disclosed herein are a solvent composition and methods of using the solvent composition, including a cleaning method, a method for removing a coating or stripping paint, and a method for depositing a material on a substrate.

The composition can be used as a solvent in, for example, refrigeration flushing, oxygen system cleaning, carrying, dispersion, and deposition, foam blowing, paints, adhesives, lubricants, and surface drying (water displacement), and can be used in cleaning operations, including, for example, vapor degreasing, cold cleaning, aerosol cleaning, ultrasonic cleaning, and dry cleaning. The solvent composition can be used on various articles, such as complex metal parts, electronic or electrical components such as circuit boards, implantable prosthetic devices, optical equipment, and others.

Solvent Composition

The solvent composition includes t-DCE and at least one organic compound. The organic compound may be, for example, a hydrocarbon and/or an oxygenated solvent. The composition is formulated such that has excellent cleaning and dissolving properties, and is characterized by low toxicity, zero ozone depletion potential, and low global warming potential.

The composition may be formulated to be an azeotrope or azeotrope-like blend of t-DCE and the one or more organic compounds, or the composition may be neither an azeotrope nor azeotrope-like.

As used herein, "azeotrope" and "azeotropic composition" refer to an admixture of two or more substances in which the admixture distills without substantial composition change and behaves as a constant boiling composition. Constant boiling compositions, which are characterized as azeotropic, exhibit either a maximum or a minimum boiling point, as compared with that of the non-azeotropic mixtures of the same substances. Azeotropic compositions as used herein include homogeneous azeotropes, which are liquid admixtures of two or more substances that behave as a single substance, in that the vapor, produced by partial evaporation or distillation of the liquid, has the same composition as the liquid. Azeotropic compositions as used herein also include heterogeneous azeotropes where the liquid phase splits into two or more liquid phases. In these embodiments, at the azeotropic point, the vapor phase is in equilibrium with two liquid phases and all three phases have different compositions. If the two equilibrium liquid phases of a heterogeneous azeotrope are combined and the composition of the overall liquid phase calculated, this would be identical to the composition of the vapor phase.

As used herein, the term "azeotrope-like composition," also sometimes referred to as "near azeotropic composition," means a constant boiling, or substantially constant boiling liquid admixture of two or more substances that behaves as a single substance. One way to characterize an azeotrope-like composition is that the vapor produced by partial evaporation or distillation of the liquid has substantially the same composition as the liquid from which it was evaporated or distilled. That is, the admixture distills/refluxes without substantial composition change. For example, the total compositional change between the vapor and the liquid after the admixture distills/refluxes is about 10% or less, or about 5% or less. Another way to characterize an azeotrope-like composition is that the bubble point vapor pressure of the composition and the dew point vapor pressure of the composition at a particular temperature are substantially the same. For example, a composition is azeotrope-like if, after 50 wt. % of the composition is removed, such as by evaporation or boiling off, the difference in vapor pressure between the original composition and the composition remaining after 50 wt. % of the original composition has been removed by evaporation or boiling off is less than about 10%.

An azeotropic or azeotrope-like composition, by definition, must include at least two components. The most common azeotropic systems are binary azeotropes and contain two components. Ternary azeotropes contain three components. Azeotropes of four or more components also exist. Disclosed herein are azeotrope or azeotrope-like compositions of at least two components. For example, the composition may be a binary azeotropic or azeotrope-like composition, which contains twos components, a ternary azeotropic or azeotrope-like composition, which contains three components, or a quaternary azeotropic or azeotrope-like composition containing four components.

It follows from the above that azeotropic and azeotrope-like compositions encompass a range of compositions containing the same components in varying proportions, all of which are azeotropic or azeotrope-like. For example, the concentration of an azeotrope will vary relative to the pressure of the system. A person skilled in the art of distillation understands that changing the pressure of the system will change the concentration of each component of the azeotrope. All such compositions are intended to be covered by the term "azeotrope" or "azeotrope-like" as used herein.

If compound A forms an azeotrope with a second compound, compound B, it would be expected that all isomers of compound A will also form an azeotrope with compound B. For example, xylene will form an azeotrope with n-butyl alcohol. As such, it would be expected that all three isomers of xylene, namely, o-, m-, and p-xylene, will for an azeotrope with n-butyl alcohol.

One way to determine if a mixture is an azeotrope or azeotrope-like is through fractional distillation. Multiple steps of evaporation and condensation of a mixture can be performed via a fractional distillation column. Such a system is designed to separate a mixture of liquid substances into individual, pure substances based on differences in their boiling points. If the mixture does not separate by fractional distillation, it is azeotropic or azeotrope-like. Analyzing the distilled fractions from a fractional distillation column can identify the concentrations of the azeotropic or azeotrope-like mixture.

A fractional distillation column can also be used to accurately determine the boiling point of the azeotrope. If a maximum or minimum temperature is reached relative to the individual substances, an azeotrope or azeotrope-like composition is present.

Azeotropic or azeotrope-like compositions can possess the properties needed for de-fluxing, de-greasing applications, and other cleaning applications. The inherent invariance of the compositions under boiling conditions ensures that the ratios of the individual components of the mixture will not change substantially during use and that solvency properties will remain constant as well. Azeotrope and azeotrope-like compositions do not fractionate. Therefore, when the solvent composition is a nonflammable azeotrope or azeotrope-like composition, it will not produce flammable compositions during use. Additionally, the used azeotropic or azeotrope-like solvent mixtures may be re-distilled and re-used without substantial composition change. Azeotropic and azeotrope-like compositions can thus be particularly useful in cleaning, defluxing, and degreasing processes. However, the composition is not necessarily an azeotrope or azeotrope-like. The composition may contain t-DCE and one or more organic compounds in amounts such that it does not form an azeotrope or azeotrope-like composition. Such compositions are also useful in cleaning and various other applications disclosed herein.

The composition may include t-DCE and the one or more organic compounds in amounts sufficient to form an azeotrope or azeotrope-like composition or a non-azeotropic composition. For example, the composition may be a binary azeotrope or azeotrope-like composition containing t-DCE and one organic compound, a ternary azeotrope or azeotrope-like composition containing t-DCE and two organic compounds, a quaternary azeotrope or azeotrope-like composition containing t-DCE and three organic compounds, or any other nonflammable azeotrope or azeotrope-like composition. Alternatively, the composition may be a non-azeotropic blend of t-DCE and one or more organic compounds.

In some embodiments, the present compositions may be nonflammable, despite a relatively large amount of t-DCE, which is considered to be flammable. It has surprisingly been discovered that certain mixtures of t-DCE and one or more organic compounds, both of which are considered to be flammable, can result in a nonflammable composition that is safer to use, handle, ship. At the same time, the nonflammable solvent composition exhibits exceptional cleaning and dissolving properties.

As used herein, the term, "nonflammable," may refer to, e.g., the absence of a flash point and/or a fire point up to the boiling point of the composition at standard atmospheric pressure as determined in accordance with one or more of ASTM D56, D1310, and D3278. In some embodiments, the composition will satisfy the criteria for nonflammability as set forth in ASTM D3065 where it is delivered via aerosol. In some embodiments, the composition has no measurable flash point.

As used herein, "trans-1,2-dichloroethylene" or "t-DCE" refers to, e.g., the trans isomer of an organochloride with the molecular formula, $C_2H_2Cl_2$. T-DCE is considered to be a flammable solvent, but has exceptional cleaning power and a lower toxicity compared to equivalent chlorinated solvents, such as trichloroethylene, tetrachloroethylene, and methylene dichloride.

As used herein, the modifier "about" used in connection with a quantity is inclusive of the stated value and has the meaning dictated by the context. For example, it includes at least the degree of error associated with the measurement of the particular quantity. When used in the context of a range, the modifier "about" should also be considered as disclosing the range defined by the absolute values of the two endpoints. For example, the range "from about 2 to about 4" also discloses the range "from 2 to 4."

Unless otherwise indicated, the amounts disclosed herein for any of the substances or solvent components included in the composition are based on a total weight of the composition. The present composition may include t-DCE in any amount sufficient to form an azeotope, azeotrope-like composition, and/or a nonflammable composition with the one or more organic compounds. For example, t-DCE may be present in an amount of at least at least 70 wt. %, at least 80 wt. %, or at least 90 wt. % based on a total weight of the composition. For example, t-DCE may be present in an amount in a range of from about 75 wt. % to about 99.9 wt. %, about 85 wt. % to about 98 wt. %, or about 90 wt. % to about 95 wt. %, based on a total weight of the composition.

The composition additionally includes at least one organic compound. The organic compound may be one or more hydrocarbons and/or oxygenated solvents. In one embodiment, the organic compound is one or more $C_1$ to $C_{50}$ aliphatic or aromatic hydrocarbons that optionally contain a heteroatom. The organic compound may be one or more $C_1$ to $C_{25}$, $C_1$ to $C_{20}$, $C_1$ to $C_{15}$, or $C_1$ to $C_{10}$ hydrocarbons optionally containing a heteroatom. The heteroatom may be, for example, one or more of oxygen, nitrogen, sulfur, phosphorus, and any other suitable heteroatom. In one embodiment, at least one organic compound contains oxygen and/or nitrogen.

In one embodiment, the organic compound may be an alkane, cycloalkane, arene, alkene, cycloalkane, alcohol, ketone, aldehyde, ether, ester, carboxylic acid, nitrile, nitro compound, heterocyclic compound, and combinations thereof. For example, the organic compound may be one or more of a $C_1$ to $C_{25}$ alkane or cycloalkane, a $C_1$ to $C_{25}$ arene, $C_1$ to $C_{25}$ alkene or cycloalkene, a $C_1$ to $C_{22}$ alcohol, a $C_1$ to $C_{22}$ ketone, a $C_1$ to $C_{22}$ aldehyde, a $C_1$ to $C_{22}$ ether, a $C_1$ to $C_{22}$ ester, a $C_1$ to $C_{22}$ carboxylic acid, a $C_1$ to $C_{10}$ nitrile, a $C_1$ to $C_{10}$ nitro compound, a $C_1$ to $C_{10}$ heterocyclic compound, and combinations thereof. In one aspect, the organic compound may be one or more of a $C_1$ to $C_{15}$ alkane or cycloalkane, a $C_1$ to $C_{15}$ arene, $C_1$ to $C_{12}$ alkene, a $C_1$ to $C_{12}$ alcohol, a $C_1$ to $C_{12}$ ketone, a $C_1$ to $C_{12}$ aldehyde, a $C_1$ to $C_{12}$ ether, a $C_1$ to $C_{12}$ ester, a $C_1$ to $C_{12}$ carboxylic acid, a $C_1$ to $C_5$ nitrile, a $C_1$ to $C_5$ nitro compound, and a $C_1$ to $C_7$ heterocyclic compound.

Non-limiting examples of the organic compound include methanol, ethanol, n-propanol, iso-propanol, n-butanol, iso-butanol, t-butanol, methyl acetate, ethyl acetate, t-butyl acetate, dimethoxy methane, dimethoxy ethane, dimethoxy propane, acetone, methyl ethyl ketone, methyl isobutyl ketone, nitromethane, dimethylcarbonate, acetic acid, acetonitrile, diethyl ether, ethylene glycol, diethylene glycol, diethylene glycol dimethyl ether, glycerin, methyl t-butyl ether, dimethyl-formamide, pyridine, dimethyl sulfoxide, butyleneoxide, furan, tetrahydrofuran, dioxane, toluene, xylene, pentane, hexane, cyclohexane, heptane, octane, pentene, hexene, cyclohexene, heptane, benzene, and combinations thereof. Any other suitable organic compound may be used in the nonflammable solvent composition disclosed herein. Even though t-DCE is flammable and is contained in the composition in a large amount, and the organic compound(s) may also be flammable, the resulting combination is surprisingly nonflammable.

The amounts of the one or more organic compounds and t-DCE in the composition may be selected so that the composition is an azeotrope, an azeotrope-like composition, and/or a nonflammable composition. For example, t-DCE may be present in the composition within the ranges discussed above, and the one or more organic compounds may be present in the composition in an amount of about 20 wt. % or less, about 10 wt. % or less, or about 5 wt. % or less, and may be present in an amount of at least about 0.01 wt. %, at least about 0.1 wt. %, at least about 0.5 wt. %, or at least about 1 wt. %. For example, the one or more organic compounds may be present in the composition in an amount in a range of from about 0.1 wt. % to about 30 wt. %, with the balance being t-DCE.

When the composition is a nonflammable composition, the amounts of t-DCE and the one or more organic compounds that produce a nonflammable composition will depend on the particular organic compound or combination thereof used in the composition. Different organic compounds and combinations thereof may be combined with t-DCE in different amounts to produce a nonflammable composition. Different amounts of the components may also vary depending on whether the composition is a binary, tertiary, quaternary, or any other azeotrope or azeotrope-like composition.

In one embodiment, the composition may consist only or predominantly of t-DCE and at least one organic compound.

The composition may also optionally contain other components that do not materially affect the composition's exceptional cleaning power. In embodiments where t-DCE and the at least one organic compound are present in azeotrope or azeotrope-like amounts, the composition may consist only or predominantly of t-DCE and the at least one organic compound. The composition may also optionally contain other components that do not materially affect the compositions exceptional cleaning power or azeotrope or azeotrope-like properties. Such components or additives include, for example, acid acceptors, metal passivators, stabilizing agents, and surfactants, and are discussed in more detail below. These optional components may be present in an amount of less than about 10 wt. %. More specifically, these optional components may be present in an amount of about 0.01 wt. % to about 5 wt. %, about 0.1 wt. % to about 3 wt. %, or about 0.1 wt. % to about 1 wt. %.

In one aspect, the solvent composition comprises less than 5 wt. %, preferably less than 2 wt. %, more preferably less than 1 wt. %, even more preferably less than 0.5 wt. % or less than 0.1 wt. %, and most preferably substantially no fluorinated organic compounds, including, for example, HFCs, HFEs, HCFCs, and perfluorocarbons. In another aspect, the nonflammable solvent composition comprises less than 5 wt. %, preferably less than 2 wt. %, more preferably less than 1 wt. %, even more preferably less than 0.5 wt. % or less than 0.1 wt. %, and most preferably substantially no halogenated organic compounds other than t-DCE. Such halogenated compounds include the fluorinated organic compounds and other halogenated compounds, such as chlorocarbons, chlorofluorocarbons, bromine containing compounds, such as n-propyl bromide, and any other halogenated organic compound other than t-DCE. As used herein, "substantially no fluorinated organic compounds" and "substantially no halogenated organic compounds" means that the composition contains less than 0.01 wt. % of fluorinated organic compounds and halogenated organic compounds, other than t-DCE, respectively. In one aspect, the composition comprises no fluorinated organic compounds. In another aspect, composition comprises no halogenated organic compounds, other than t-DCE.

An exemplary solvent composition includes t-DCE and one or more alcohols, such as methanol, ethanol, isopropanol, n-propanol, n-butanol, iso-butanol, t-butanol, and any other suitable alcohol. The one or more alcohols may be present in the composition in an amount of from about 0.1 wt. % to about 20 wt. %, about 0.5 wt. % to about 15 wt. %, and about 1 wt. % to about 10 wt. %, with the balance being t-DCE.

For example, the solvent composition may include t-DCE and isopropanol. A nonflammable azeotrope is formed when t-DCE is present in an amount of about 95.7 wt. % and isopropanol is present in an amount of about 4.3 wt. %. In some embodiments, the composition may include t-DCE in an amount of from about 85 to about 99 wt. % and isopropanol in an amount of from about 1 to about 15 wt. %. The composition may be formulated to be azeotropic or azeotrope-like, or the composition may be formulated such that it is not azeotropic or azeotrope-like.

Another exemplary solvent composition includes t-DCE and n-propanol. A nonflammable azeotrope is formed when t-DCE is present in an amount of about 99 wt. % and n-propanol is present in an amount of about 1 wt. %. In some embodiments, the composition may include t-DCE in an amount of from about 90 to about 99.5 wt. % and isopropanol in an amount of from about 0.5 wt. % to about 10 wt. % of n-propanol. The composition may be formulated to be azeotropic or azeotrope-like, or the composition may be formulated such that it is not azeotropic or azeotrope-like.

An additional exemplary solvent composition includes t-DCE and ethanol. A nonflammable azeotrope is formed when t-DCE is present in an amount of about 94 wt. % and ethanol is present in an amount of about 6 wt. %. In some embodiments, the composition may include t-DCE in an amount of from about 80 to about 99 wt. % and ethanol in an amount of about 1 to about 20 wt. %. The composition may be formulated to be azeotropic or azeotrope-like, or the composition may be formulated such that it is not azeotropic or azeotrope-like.

Another exemplary solvent composition includes t-DCE and methanol. A nonflammable azeotrope is formed when t-DCE is present in an amount of 91 wt. % and methanol is present in an amount of 9 wt. %. In some embodiments, the composition may include t-DCE in an amount of from about 80 to about 99 wt. % and methanol in an amount of from about 1 to about 20 wt. %. The composition may be formulated to be azeotropic or azeotrope-like, or the composition may be formulated such that it is not azeotropic or azeotrope-like.

The compositions are not limited to these examples. Compositions containing t-DCE and any of the organic compounds discussed above may be formulated to have excellent cleaning and dissolving power.

In some embodiments, the compositions may be formulated to have reduced flammability or be nonflammable. Even though the composition contains a significant amount of t-DCE, which is considered to be flammable, and one or more potentially flammable organic compounds, and the composition contains substantially no fluorinated organic compounds or halogenated organic compounds (other than t-DCE), which was used in prior art methods to reduce or eliminate flammability of t-DCE, the resulting composition can be surprisingly nonflammable. In some embodiments, the solvent composition, which includes a range of concentrations of the various solvent components, can be formulated to have excellent cleaning and dissolving power, while at the same time, maintaining nonflammability characteristics. In this regard, t-DCE and the one or more organic compounds individually exhibit good solvent cleaning and dissolving properties. The combination of t-DCE and one or more organic compounds synergistically exhibits excellent cleaning and dissolving properties, and can be nonflammable.

The compositions do not have the negative environmental impact of the prior art compositions including, for example, CFC's, HCFC's, or HFC's. Therefore, the solvent composition as formulated is acceptable for use in essentially all of the electrical, electromechanical, mechanical, and other applications disclosed herein. The unique combination of solvent components provides a composition in which the cleaning power of the solvent composition can be varied to suit a desired application.

In the embodiments in which the compositions are azeotropic or azeotrope-like, the compositions may be re-distilled and re-used without substantial composition change without significant loss of the composition. The azeotropes and azeotrope-like compositions are very easy to distil and recover. If used in a vapor degreaser, the composition can be continuously boiled and recycled with little waste while the contaminants stay trapped at the bottom of the machine. The azeotropes and azeotrope-like compositions are ideal for vapor degreasing because they do not fractionate upon boiling, and the distillate and residue do not have substantial changes in composition. Therefore, the composition is not shifted into a flammable range during vapor degreasing. The disclosed compositions are also advantageous for use in a number of applications other than vapor degreasing. For example, the compositions have utility in other solvent cleaning applications, dewatering and drying processes, coating deposition, heat-transfer processes, foaming blowing applications, refrigeration flushing, lubrication applications, and many others.

Regardless of whether the composition is azeotropic, azeotrope-like, or non-azeotropic, the disclosed compositions have high solvency power, and are characterized by zero ODP and low GWP, as well as low toxicity, and many of the compositions are nonflammable or have reduced flammability. The compositions are therefore advantageously used in a variety of applications, such as solvent cleaning, such as vapor degreasing and wet cleaning; dewatering and drying processes; deposition of a coating, such as paints, lubricants, adhesives, penetrants, and surface protectants, onto a substrate; heat-transfer processes; foaming blowing applications; refrigeration flushing; lubrication applications; and many others.

Additives

As mentioned above, the composition may also optionally contain other components that do not materially affect the composition's exceptional cleaning power. For example, the present composition may also contain one or more additives, such as stabilizers, inhibitors, surfactants, acid acceptors, metal passivators, and antioxidants. Such additives typically are added at the expense of the other components and in amounts known to one skilled in the art. The total amount of such additives may be in an amount of up to about 10 wt. % based on the total weight of the composition or up to about 5 wt. % based on the total weight of the composition. More specifically, these optional components may be present in an amount of about 0.01 wt. % to about 5 wt. %, about 0.1 wt. % to about 3 wt. %, or about 0.1 wt. % to about 1 wt. % based on a total weight of the composition. In some embodiments, the total amount of additives may be present in the composition in an amount of up to about 10 wt. % or up to about 5 wt. % based on the total weight of the remainder of the composition.

For example, in some embodiments, stabilizers may be added to the present composition. Stabilizers are typically added to solvent compositions to inhibit decomposition of the compositions, and/or prevent corrosion of metal surfaces. Stabilizers react with undesirable decomposition products of the compositions. Any combination of conventional stabilizers known to be useful for stabilizing hydrocarbon solvents may be used in the present composition. Suitable stabilizers include, for example, alkanols having 4 to 7 carbon atoms, nitroalkanes having 1 to 3 carbon atoms, 1,2-epoxyalkanes having 2 to 7 carbon atoms, phosphite esters having 12 to 30 carbon atoms, ethers having 3 or 4 carbon atoms, unsaturated compounds having 4 to 6 carbon atoms, acetals having 4 to 7 carbon atoms, ketones having 3 to 5 carbon atoms, and amines having 6 to 8 carbon atoms. Other suitable stabilizers are readily known by those skilled in the art.

Additionally, various known alcohols and other solvents may also be included in the composition in small quantities, such as of about 0.01 wt. % to about 5 wt. %, about 0.1 wt. % to about 3 wt. %, or about 0.1 wt. % to about 1 wt. % based on the total weight of the composition. Known alcohols and solvents that may be added in small amounts to the present composition include methanol, ethanol, isopropanol, n-butanol, isooctanol, methyl isobutyl carbinol, isoamyl alcohol, isobutyl alcohol, tert butyl alcohol, cyclohexanol, methyl cyclohexanol, benzyl alcohol, benzoic acid, furfuryl alcohol, and the like.

In addition, minor amounts of surfactants can also be included. Typical surfactants useful in the composition may include ionic and non-ionic surface active agents, for example, sulfonate salts, phosphate salts, carboxylate salts, fatty acids, alkyl phenols, glycols, esters and amides. Surface active agents also include ionic and non-ionic water displacement compounds, such as tetra-alkyl ammonium sulfonate, phosphate, and carboxylate and bromide salts, aliphatic amino alkanols, fluorinated amino alkanols, and chlorofluorinated amino alkanols.

The composition preferably contains substantially no halogenated organic compounds other than t-DCE. However, in some embodiments, the composition may include very small amounts of one or more fluorocarbons. In embodiments where the composition is an azeotrope or azeotrope-like composition, the fluorocarbon is added in a manner such that the azeotropic behavior is not disturbed. Non-limiting examples of the fluorocarbons include heptafluorocyclopentane, perfluoro(2-methyl-2-pentene), (E-Z) perfluoro(4-methyl-2-pentene), 1,1,1,4,4,5,5,5-octafluoro-2-pentene, perfluorobutyl methyl ether, perfluorobutyl ethyl ether, perfluoroisopropylmethyl ether, perfluoroethyl isopropyl ketone, E-1,1,1-trifluoro-3-chloro-2-propene, 1,1,1,3,3-pentafluorobutane, 1,1,2,2-tetrafluoroethyl 2,2,2-trifluoroethyl ether, and any other fluorocarbon suitable for use in the solvent compositions. In embodiments containing a fluorocarbon, the fluorocarbon may be present in an amount in a range of from about 0.01 to about 5 wt. %, about 0.1 to about 2.5 wt. %, or about 0.5 to about 1 wt. %.

Many of the compositions disclosed herein exhibit reduced flammability or are nonflammable even when they contain substantially no halogenated organic compounds, other than t-DCE. However, in some embodiments, a very small amount of a fluorocarbon can be added to the composition, which may have further reduced flammability or be nonflammable. This is equally surprisingly in view of the relatively large amount of t-DCE, which is considered flammable, in combination with at least one organic compound, which may also considered flammable.

Methods of Preparing the Composition

The present compositions may be prepared by admixing effective amounts of t-DCE and at least one organic compound. The amounts of t-DCE and the one or more organic compounds may be selected to produce a composition that is nonflammable, azeotropic, and/or azeotrope-like, or t-DCE and the one or more organic compounds may be combined in a manner to produce a composition that is neither azeotropic nor azeotrope-like. The order of addition of the components is not critical. When desired, one or more other components or additives may be optionally added.

Methods of Cleaning

A method of cleaning a surface includes contacting the surface with the solvent composition to dissolve one or more contaminants on the surface. The article may be contacted with the solvent composition via cold cleaning, for example, when the article is an electrical or electronic device or component to avoid the danger of fire or an explosion, for example, when the device is connected to a power source, such as an alternating current (AC) power source or a battery. The composition may then be removed from the surface. The method of cleaning reduces the level of contaminants on the surface. Therefore, after contacting the surface with the composition, the surface is substantially free of contaminants and is also substantially free of residue from the solvent composition.

The solvent composition disclosed herein may be used to clean the surface of any device, article of manufacture, product, part, component, substrate, or any portion thereof that may be subject to contamination by unwanted materials. For example, the solvent composition may be used to clean the surface of machine parts, tools, component assemblies, complex metal parts, implantable prosthetic devices, electrical and electronic components, switches, circuits, boards, printed circuit boards, semiconductor chips, magnetic media, disk drive heads, avionics, connectors, relays and contacts, solenoids, motor and motor windings, circuit breakers, circuit breaker panels, transformers, electrical and data communication connectors and switching devices, electronic controls, timers, cable assemblies, splices and terminations, hydraulic and pneumatic equipment, optical equipment, fiber optics, metal or metal oxide products, glass products, plastics, elastomers, photographic and movie film, molds for casting plastics, surfaces being prepared for painting, fabrics, animal hides, ceramics, stone or stone-like materials such as concrete, wood, natural fibers, synthetic fibers, PVC pipes, optical lenses, polymeric substrates, and the like, and any portion thereof. The surface may be of an article connected to a power source, such as an AC power source, a battery, or the like.

The term, "contaminant" is used in a broad sense to designate any unwanted material or substance present on the article, even if the material or substance was placed on the article intentionally. For example, circuit boards, commonly used in electronic appliances, such as televisions and computers, are often contaminated with solder flux in the assembly process. Solder flux is a grease-like substance that is either applied to the surface of the board before soldering, or is contained in the core of the solder itself, in order to help the solder retain heat and spread onto a surface. This sticky flux residue must then be removed from the surface of the circuit board. Non-limiting examples of "contaminant" include flux (e.g., solder flux), grease, wax, oil, polymer, lubricant, dirt, lint, dust, particulate matter, corrosive materials, oxidation products, residue, and the like. For example, the composition may be used to remove relatively heavy motor oil and lighter weight oils, such as machine oils or other light-weight lubricants, such as silicone or Teflon® polytetrafluoroethylene (PTFE).

The composition may be used to clean electronic or electrical devices or components, such as integrated circuits or silicon chips. For example, it is necessary to clean silicon chips are manufacturing simply to remove any possible contamination, as these delicate parts must be absolutely clean to perform properly.

The contacting of the article with the composition may be performed in a variety of ways. In some embodiments, the contacting is performed via wet cleaning or vapor degreasing. The wet cleaning can be performed on, for example, electronic or electrical components or devices. These electronic or electrical components or devices may be connected to a power source.

The contacting step may be performed in any suitable apparatus or vessel, including, for example, in a reaction vessel, sump, vat, dip tank, autoclave, vapor degreaser, or the like, and may be conducted while open or closed to the atmosphere. In some embodiments, the contacting need not be performed in an apparatus or vessel at all.

The wet cleaning may be performed via a parts washer, any batch loaded, non-boiling degreaser, sprays, aerosols, and the like. For example, the wet cleaning may involve spraying the composition onto the article, flushing the article with the composition, wiping the article with an absorbent medium containing the composition, or immersing the article in the composition. In some embodiments, the composition is sprayed onto the surface of the article. The composition may be sprayed in the form of a liquid or an aerosol. For example, a jet stream of the present composition may be sprayed onto the article. The composition may be sprayed onto the article from a trigger bottle or pump sprayer. The surface of the article can be brushed or wiped before, during, or after spraying the composition onto the surface of the article. For example, the article may be brushed or wiped to assist in cleaning, particularly if the article contains an excessive amount of contaminants. Such brush or wiping can be effective in enhancing penetration of the contaminants by the solvent composition.

In some embodiments, the composition may be sprayed onto the surface as an aerosol. In such embodiments, the composition may be combined with a propellant to create an aerosol, such as nitrogen and carbon dioxide. These propellants are highly beneficial because of their nonflammability and low or no VOC properties. Additional propellants, including flammable propellants, nonflammable propellants, VOC free propellants, and VOC containing propellants, may be used, however, without departing from the spirit and the scope of the present invention. Furthermore, the flammable properties of traditionally flammable propellants, such as butane and propane, may be reduced or eliminated when used in connection with the present composition. The propellant may be present in the aerosol in an amount of about 3 to about 50 wt. % based on a total weight of the aerosol.

The aerosol may be inserted into an aerosol container capable of spraying the aerosol and/or mixed with boron nitride powder and/or other compatible powder additives, such as metal powders, to create an aerosol mixture. The aerosol spray container, such as an aerosol can, can be used to spray the aerosol onto the surface of an article.

In some embodiments, wet cleaning may involve fully or partially immersing or soaking an article in the composition with or without agitation. For example, the wet cleaning may be performed by contacting the article in a sump, vat, dip tank, or the like containing the solvent composition. The article can be optionally subjected to ultrasonic agitation, or contacted with a jet stream of the solvent composition. In one aspect, the solvent composition is sprayed onto the article prior to degreasing, such as vapor degreasing.

Ultrasonics may be used in conjunction with the wet cleaning for removing at least one of water or water-soluble contaminants from, for example, deep recesses or inaccessible areas.

The wet cleaning may include contacting the surface of the article with an absorbent medium containing the composition. The absorbent medium may be, for example, a cloth, swab, paper, or brush saturated with the composition. The surface of the article may be wiped, rubbed, or brushed with the absorbent medium. For example, when the absorbent medium is a cloth, the article may be wiped with the cloth to wet clean the article.

The wet cleaning may be performed at a temperature in a range of about 10° C. to about 47° C., such as about 15° C. to about 30° C., about 20° C. to about 26° C., or about ambient or room temperature. In some embodiments, the wet cleaning is performed on an electronic or electrical component or device at about ambient temperature. Methods of wet cleaning electronic or electrical components or devices using a nonflammable composition are advantageous in that they can minimize or reduce the danger of a fire during the cleaning, particularly for electronic/electrical components that are connected to power sources and/or where the power remains on during cleaning.

For difficult to remove soils, where elevated temperature is necessary to improve the cleaning action of the solvent composition, or for large volume assembly line operations, where the cleaning of metal parts and assemblies must be done efficiently, a vapor degreaser may be employed. In its simplest form, vapor degreasing, involves exposing a room temperature article to be cleaned to the vapors of a boiling solvent composition. The vapors condensing on the article provide a clean distilled solvent to wash away grease or other contaminants. Final evaporation of the solvent from the article leaves substantially no residue on the article.

Azeotropic or azeotrope-like solvent compositions may be desired in vapor degreasing applications because they do not fractionate upon boiling. This behavior is desirable because in vapor degreasing equipment, in which the solvent composition is employed, redistilled solvent is generated for a final rinse cleaning. Thus, the vapor degreasing system acts as a still. Unless the solvent composition exhibits a constant boiling point, i.e., is at least azeotrope-like, fractionation may occur and undesirable solvent distribution may upset the cleaning and safety of the process.

In some embodiments, the contacting may be performed via vapor degreasing. Vapor degreasing can be performed in an open or closed vapor degreasing apparatus. It is contemplated that numerous varieties and types of vapor degreasing equipment are adaptable for use in connection with the present methods. For example, the equipment may include a boiling sump for containing the cleaning composition, a clean sump for containing the distilled cleaning composition, a water separator, and any other ancillary equipment.

In some embodiments, vapor degreasing may be performed by heating or boiling the composition to vaporize the composition, and exposing the article to vapors of the composition. For example, the liquid solvent composition may be heated in a reservoir to vaporize the composition. The vapors of the composition can condense on the surface of the article during exposure of the article to the vapors. The surface of the article can be relatively cold compared to the relatively hot vapor. The condensed vapors can then solvate or entrain one or more contaminates on the surface of the article. The contaminated solvent (i.e., the condensed solvent containing the dissolved contaminants) can then be drained into the reservoir, for example, by falling from the article into the reservoir under the influence of gravity. The reservoir can be the same reservoir containing the liquid solvent composition that is being heated to vaporize the composition. The liquid solvent composition can be vaporized continuously to form a vapor blanket comprising the composition. Because only the solvent composition is vaporized (and not the contaminants), the contaminants remain in the reservoir, for example, in the form of a sludge. The article can therefore be continuously flushed with the non-contaminated solvent composition.

The contacting of the vapor with the article in some embodiments creates a scrubbing action as the vapor condenses on the article. The article can be maintained in contact with the vapor composition for a period of time to raise the temperature of the article to about the temperature of the vapor, whereupon condensation substantially ceases and the article appears dry. The article can then be removed from the degreaser. The time required to cause cessation of the condensation process varies depending upon numerous factors, including the particular solvent composition employed, the temperature of the vapor, the weight of the article, its specific heat, and the type of contamination material to be removed.

The vapor degreasing can be beneficially used in some embodiments to contact the surface of the article, as well as penetrate any holes, cracks, or crevices of the article, so as to remove contaminants therefrom.

Another type of vapor degreasing is referred to as vapor-spray cycle degreasing. In vapor-spray cycle degreasing, the article to be cleansed is first placed in a vapor zone, as is done in the above-described vapor degreasing process. A portion of the vapor is condensed by use of cooling coils and fills a liquid solvent reservoir. Warm liquid solvent is pumped through a spray nozzle which sprays it directly onto the part to be degreased, thus washing off contaminants and cooling the article.

In some embodiments, the vapor phase degreasing may be liquid-vapor cycle degreasing. In liquid-vapor cycle degreasing, a first compartment contains a refluxing solvent and a second compartment contains a somewhat cooler solvent condensate, which is referred to as the rinse sump. A vapor zone is maintained over the refluxing solvent. In this type of degreasing operation, the article to be cleaned is first suspended in the vapor zone until condensation of vapor on the article ceases. Next, the article is lowered into the refluxing solvent in the first compartment. After a suitable period of time, the article is removed to the rinse sump. Finally, the parts are again placed in the vapor zone until dry. This type of degreasing may be particularly useful for heavily soiled articles or for cleaning a basket or container of small parts that are nested together.

In some embodiments, the vapor phase degreasing is ultrasonic degreasing. Ultrasonic degreasing can be useful for cleaning critical parts and typically uses a transducer that is mounted at the base of a solvent tank and operates in the range of 20 to 40 kHz. The transducer alternately compresses and expands the solvent composition, thereby forming small bubbles that, in turn, cavitate or collapse on the surface of the article. This cavitation phenomenon disrupts the adhering contaminants, thereby cleaning the article.

Because vapor degreasing operations generally involve the use of a heat source in relatively close proximity to the degreasing solvents in both liquid and vapor states, it is highly beneficial to use a solvent composition that remains nonflammable through all parts of the degreasing process/apparatus in order to minimize or reduce the danger of fire or explosion. Similarly, it is highly recommended to use a nonflammable composition for cleaning electronic or electrical components or devices to minimize or reduce the danger of the component or device catching fire.

The methods of cleaning, particularly wet cleaning of an electrical or electronic component or device, or vapor degreasing of an article using a nonflammable composition is highly advantageous at least because it reduces the risk of fire or an explosion. Another advantage of the present methods of cleaning using a nonflammable composition is that precautions against the hazard of flammability or explosion need not be taken. Further, there is no need to label storage tanks containing the composition with signs or warnings against those risks.

An azeotrope or azeotrope-like composition mays also be preferred for use in a vapor degreasing process because both the distillate and residue do not have substantial changes in composition. Therefore, the composition is not shifted into a flammable range during vapor degreasing. Further, even after partial distillation, the composition of both the residue and of the distillate retains the composition's properties, for example, its ability to degrease, dewater, and solubilize contaminants.

After contact with the composition, the composition may be removed from the surface of the article by evaporation of the composition, draining the composition off the surface, or wiping or brushing the composition off the surface. For example, the solvent composition along with the dissolved contaminants may be removed from the surface of the article by wiping it away, such as with a cloth or other material, or by letting the solvent composition run off into a pan or other collection device. In some embodiments, the surface of the article is recovered from the composition by allowing the composition to evaporate, for example, due to the natural evaporation tendencies of the composition. The present composition can evaporate quickly. In some embodiments, the composition can evaporate at ambient or room temperature. Alternatively, the article may be heated to facilitate evaporation of the composition. For example, the article may be contacted with a jet stream of warm air to facilitate evaporation of the composition.

Use of the present composition is advantageous because substantially no residue from the composition itself remains on the surface after cleaning. Not only might residue interfere with the performance of the article, for example, an electrical or electronic component, but it could also damage the article. The present composition advantageously leaves substantially no residue, while simultaneously being strong enough to tackle tenacious contaminants. As a result of the methods of cleaning disclosed herein, one or more contaminants are removed from the article, for example, by being dissolved in the composition.

Other Methods of Using the Composition

Other non-limiting examples of uses for the present solvent compositions include their use as solvents in refrigeration flushing, oxygen system cleaning, foam blowing, paints, adhesives, lubricants, drycleaning, and systems for depositing a material onto a substrate, for example to deposit silicone fluids on hypodermic needles, to deposit lubricating oils in very small and inaccessible places, to deposit paints and varnishes, and to deposit glues.

The methods of depositing a material onto a substrate may involve using the composition as a carrier solvent in applications including, for example, paints, lubricants, adhesives, penetrants, coatings, and surface protectants. For example, a material may be deposited on a substrate by dissolving the material in the present composition, applying the composition containing the material onto the substrate, and evaporating the composition such that the material remains on the substrate. Materials may include, for example, polymers, waxes, oils, silicone fluids, other lubricants, paints, pesticides, insecticides, and fungicides.

More specifically, the composition may be used for dissolving materials, and for removing these materials from, and/or delivering these materials to a surface. For example, after the composition dissolves one or more materials, these materials may be reconstituted on any number of surfaces for the purpose of providing a coating.

Solvent compositions are advantageous in systems where one or more materials are dissolved in the solvent composition and then deposited on a substrate upon evaporation of the solvent. Azeotropes and azeotrope-like compositions may be preferred for such systems because the solubility parameters of the solvent composition remain relatively constant as the azeotrope or azeotrope-like composition evaporates.

A material or substance may be dissolved in the present composition. Then, this liquid is applied to a substrate by dipping, brushing, or spraying, including aerosol spraying. Next, the present composition is evaporated from the substrate by heating, or by the natural evaporation tendencies of the composition. The material or substance is then left behind on the substrate in an even, thorough coating.

In another embodiment, the solvent composition may be used to remove a coating from a substrate. In this method, the substrate is contacted with the solvent composition to dissolve the coating, and then the composition containing the dissolving coating is removed from the substrate. In one aspect, the coating may be paint and the composition may be used to strip paint from a substrate.

In another aspect, the solvent composition may be used in a drycleaning method including, for example, contacting a fabric or fiber with the solvent composition. Non-limiting examples of the fabric or fiber include a garment, bedding, furniture covering, rug, wall covering, drapery, napkin, or tablecloth. The fabric or fiber may be made of, for example, cotton, wool, silk, rayon, polyester, nylon, acetates, polyolefins, acrylics, spandex, and blends thereof. After contacting the fabric or fiber with the solvent composition, the fabric or fiber may be heated to remove any remaining solvent composition from the fabric or fiber. The drycleaning solvent composition may also include a detergent, antistatic agent, surfactant, fabric softener, brightener, disinfectant, anti-redeposition agent, fragrance, or a mixture thereof.

The solvent composition may be used in a blowing agent composition. The blowing agent may be used to prepare a foam. For example, a method may include providing a blowing agent composition, directly or indirectly adding the blowing agent composition to a foamable composition, and reacting the foamable composition under the conditions effective to form a foam or cellular structure, as is well known in the art. For example, a blowing agent including the solvent composition may be vaporized in the presence of a foamable composition to form a foam. Other materials, such as catalysts, surfactants, and optionally, flame retardants, colorants, or other additives may also be combined with the blowing agent and foamable composition.

The solvent composition may also be used as a heat transferring fluid or a working fluid in heat transfer systems, such as in refrigeration and air-conditioning systems. The heat transfer methods may include providing the solvent composition and causing heat to be transferred to or from the composition, either by sensible heat transfer, phase change heat transfer, or a combination of these. For example, in one aspect, a refrigeration system including a refrigerant including the solvent composition is provided. A method of producing heating or cooling by condensing and/or evaporating the solvent composition is also provided. In one aspect, the methods for cooling, including cooling of other fluid either directly or indirectly or a body directly or indirectly, comprise condensing a refrigerant composition comprising the solvent composition, and thereafter evaporating said refrigerant composition in the vicinity of the article to be cooled. The solvent composition may also provide cooling by absorbing heat from a fluid or body, for example, by evaporating the refrigerant composition comprising the solvent composition in the vicinity of the body or fluid to be cooled to produce vapor comprising the present composition. In another embodiment, the solvent composition may be used in a method for producing heating. The method may include condensing a refrigerant comprising the solvent composition in the vicinity of a liquid or body to be heated.

The present compositions and methods offer several advantages over existing compositions and methods, including, for example, improved cleaning and dissolving power and, in some embodiments, surprising reduced flammability or nonflammability. The compositions disclosed herein have additional desired characteristics, such as polar functionality, increased solvency power, and increased stability while retaining those properties exhibited by prior art formulations including fluorinated organic compounds and/or halogenated organic compounds (other than t-DCE), such as chemical stability, low toxicity, and nonflammability. Flammability is an important and/or essential property for many applications, including, for example, vapor degreasing, cleaning of an electrical component (for example, connected a power source), heat transfer, and blowing agent applications. The solvent compositions including t-DCE and at least one organic compound can be surprisingly nonflammable even when they contain substantially no fluorinated or halogenated compounds (other than t-DCE), and are excellent in solvent cleaning and other applications mentioned above.

The present compositions and methods offer several advantages over existing compositions and methods. The compositions and methods, as well as their advantages will be described in greater detail by way of specific examples. The following examples are offered for illustrative purposes and are not intended to limit or define the invention in any manner.

EXAMPLES

The preparation, identification, and testing of the compositions of this disclosure are further described in the following examples. The particular materials and amounts thereof used in these examples, as well as other conditions and details, should not be construed to unduly limit this invention. In these examples, all percentages, proportions, and ratios are by weight unless otherwise indicated.

All the chemical components which are disclosed here are commercially available through chemical distributors such as Aldrich Chemical Company, Inc. (Milwaukee, Wis.).

Example 1

Mixtures of Iso-Propanol and t-DCE were distilled at ambient pressure. The distillate fractions were analyzed to identify whether these mixtures formed a binary azeotrope, and if so, the composition (% by weight) and boiling point (b.p. ° C.) of the azeotrope, using the following procedure. The mixtures were prepared and distilled at ambient pressure in a glass filled distillation column (available from Ace Glass, Vinland, N.J.). The entire distillation apparatus (heat, temperature, reflux ratio) was continuously controlled and recorded by ShotoLab software (available from Shoto Technologies in Bayonne, N.J.). In each case, the distillation was allowed to equilibrate at total reflux for at least 30 minutes. For each distillation, six to eighteen successive distillate cuts were taken, each approximately 5-10 percent by volume of the total liquid charge, while operating the column at a liquid reflux ratio of 10:1. In some of the tests, the distillation was carried until all the liquid totally evaporated.

Figure 5:
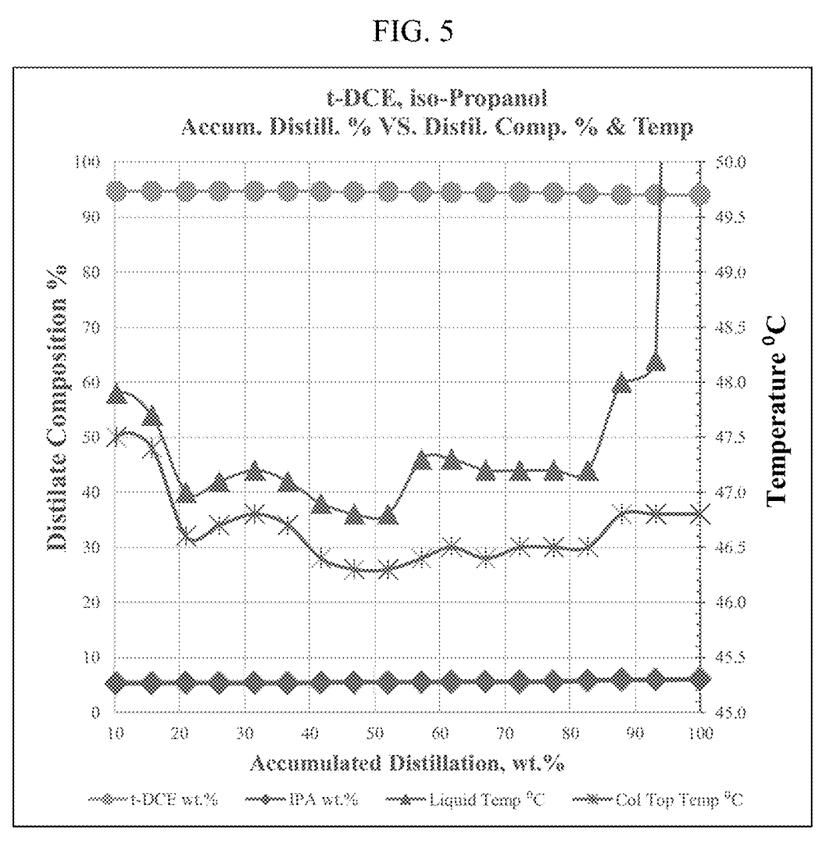
FIG. 5 is a line chart showing the average composition and temperature of successive distillate fractions of a composition of t-DCE and iso-propanol.

The temperatures were measured at 4 locations in the system (liquid in the flask, vapors above the liquid in the flask, vapors at the top of the distillation column, and the vapors near the condenser) and recorded continuously. The compositions of the distillate cuts were then analyzed using an AGILENT 6890 Gas Chromatograph. The presence of an azeotrope was confirmed by a distillate vapor temperature below the boiling point of the two individual components and a surprisingly constant distillate composition throughout 80% of the distillation. For each distillation, the average composition and temperature of all distillate fractions were recorded and measured. This procedure was repeated several times for each mixture. Using this procedure, the following azeotropes listed in Table 1 were identified. The reported composition and boiling point for each azeotrope are provided in Table 1 below. The results are shown in Table 1 below and FIG. 5.

TABLE 1

| Cut # | Accumulated Distillation % | Liquid Boiling Point ° C. | Col. Top. Temp ° C. | t-DCE, wt. % | IPA, wt. % |
|---|---|---|---|---|---|
| 01 | 5.40 | 47.5 | 46.9 | 94.72 | 5.28 |
| 02 | 10.30 | 47.9 | 47.5 | 94.66 | 5.34 |
| 03 | 15.75 | 47.7 | 47.4 | 94.66 | 5.34 |
| 04 | 21.00 | 47.0 | 46.6 | 94.62 | 5.38 |
| 05 | 26.10 | 47.1 | 46.7 | 94.65 | 5.35 |
| 06 | 31.55 | 47.2 | 46.8 | 94.65 | 5.35 |
| 07 | 36.65 | 47.1 | 46.7 | 94.66 | 5.34 |
| 08 | 41.75 | 46.9 | 46.4 | 94.62 | 5.38 |
| 09 | 46.85 | 46.8 | 46.3 | 94.53 | 5.47 |
| 10 | 52.04 | 46.8 | 46.3 | 94.56 | 5.44 |
| 11 | 57.19 | 47.3 | 46.4 | 94.52 | 5.48 |
| 12 | 61.79 | 47.3 | 46.5 | 94.46 | 5.54 |
| 13 | 67.04 | 47.2 | 46.4 | 94.42 | 5.58 |
| 14 | 72.29 | 47.2 | 46.5 | 94.46 | 5.54 |
| 15 | 77.49 | 47.2 | 46.5 | 94.37 | 5.63 |
| 16 | 82.74 | 47.2 | 46.5 | 94.24 | 5.76 |
| 17 | 87.94 | 48.0 | 46.8 | 94.08 | 5.92 |
| 18 | 93.19 | 48.2 | 46.8 | 94.04 | 5.96 |
| 19 | 100.00 | 70.0 | 46.8 | 93.96 | 6.04 |

Throughout the distillation, especially between the cuts at 5% (cut #02) and 90% (cut #17), the distillation temperatures and compositions remained remarkably constant and practically identical to the boiling liquid temperatures, which indicates the presence of an azeotrope. On average, the composition of 5.6±0.3 weight % IPA and 94.3±0.3 weight % t-DCE was observed.

Compositions having a boiling temperature of less than the boiling point of each pure component were considered evidence of at least azeotrope-like behavior. For the t-DCE and IPA mixtures, this azeotrope-like range was found to be from about 0.5 wt. % IPA to about 12.5 wt. % IPA Example 2

Figure 4:
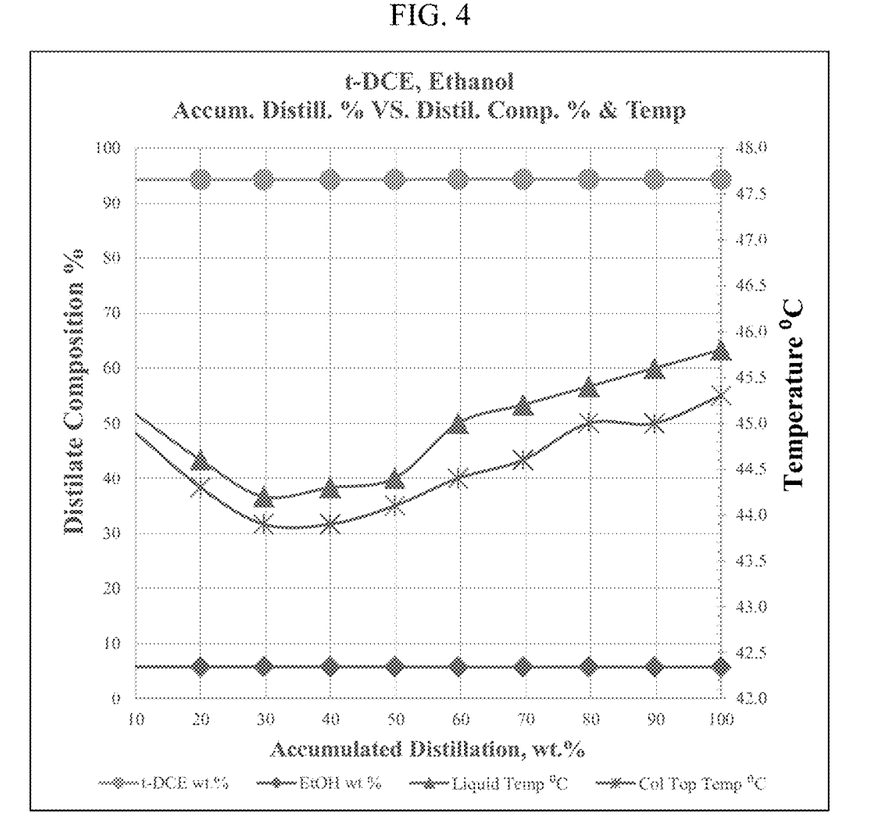
FIG. 4 is a line chart showing the average composition and temperature of successive distillate fractions of a composition of t-DCE and ethanol.

The process of Example 1 was repeated with Ethanol and t-DCE. The cuts were taken until the flask had about 20% leftover (bottoms) of the original blend. The results are shown in Table 2 and FIG. 4.

TABLE 2

| Cut # | Accumulated. Distillation % | Liquid BP ° C. | Col Top Temp ° C. | t-DCE wt. % | Ethanol wt. % |
|---|---|---|---|---|---|
| 01 | 9.99 | 45.1 | 44.9 | 94.22 | 5.78 |
| 02 | 20.01 | 44.6 | 44.3 | 94.22 | 5.78 |
| 03 | 29.71 | 44.2 | 43.9 | 94.21 | 5.79 |
| 04 | 39.91 | 44.3 | 43.9 | 94.22 | 5.78 |
| 05 | 49.84 | 44.4 | 44.1 | 94.23 | 5.77 |
| 06 | 59.59 | 45.0 | 44.4 | 94.29 | 5.71 |

TABLE 2-continued

| Cut # | Accumulated. Distillation % | Liquid BP ° C. | Col Top Temp ° C. | t-DCE wt. % | Ethanol wt. % |
|---|---|---|---|---|---|
| 07 | 69.57 | 45.2 | 44.6 | 94.29 | 5.71 |
| 08 | 79.66 | 45.4 | 45.0 | 94.25 | 5.75 |
| 09 | 89.75 | 45.6 | 45.0 | 94.29 | 5.71 |
| 10 | 100.00 | 45.8 | 45.3 | 94.24 | 5.76 |

Throughout the distillation, the distillation temperatures and compositions remained remarkably constant, which indicates azeotropic behavior. On average the composition of 5.74±0.03 weight % ethanol and 94.25±0.04 weight % t-DCE was observed.

Example 3

Figure 3:
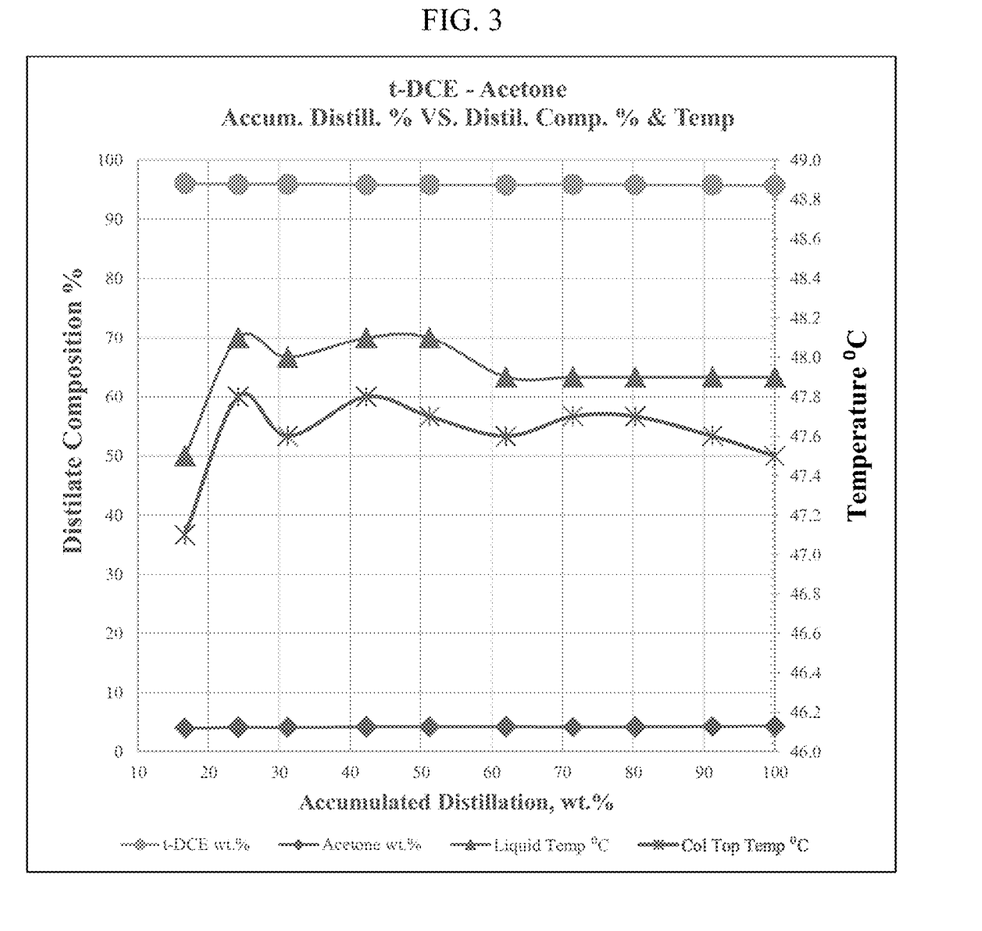
FIG. 3 is a line chart showing the average composition and temperature of successive distillate fractions of a composition of t-DCE and acetone.

The same distillation procedure as in Example 1 was performed with acetone and t-DCE. The cuts were taken until about 80% have been distilled and the still bottoms were about 20% of the original flask load. The results are shown in Table 3 and FIG. 3.

TABLE 3

| Cut # | Accumulated Distillation % | Liquid Temp ° C. | Col Top Temp ° C. | t-DCE wt. % | Acetone wt. % |
|---|---|---|---|---|---|
| 01 | 16.7 | 47.5 | 47.1 | 96.03 | 3.97 |
| 02 | 24.2 | 48.1 | 47.8 | 95.89 | 4.11 |
| 03 | 31.2 | 48.0 | 47.6 | 95.90 | 4.10 |
| 04 | 42.3 | 48.1 | 47.8 | 95.81 | 4.19 |
| 05 | 51.2 | 48.1 | 47.7 | 95.80 | 4.20 |
| 06 | 62.0 | 47.9 | 47.6 | 95.79 | 4.21 |
| 07 | 71.5 | 47.9 | 47.7 | 95.85 | 4.15 |
| 08 | 80.3 | 47.9 | 47.7 | 95.81 | 4.19 |
| 09 | 91.2 | 47.9 | 47.6 | 95.76 | 4.24 |
| 10 | 100 | 47.9 | 47.5 | 95.70 | 4.3 |

It can be observed that throughout the distillation, the distillation temperatures and compositions remained relatively constant which indicates azeotropic behavior. On average the composition of 4.15±0.15 weight % acetone and 95.85±0.15 weight % t-DCE was observed.

Compositions which have a boiling temperature of less than the boiling point of each pure component were considered evidence of azeotrope-like behavior. For the acetone and t-DCE mixtures, this azeotrope-like range was found to be about 0.5 wt. % acetone to about 15 wt. % acetone.

Example 4

Figure 2:
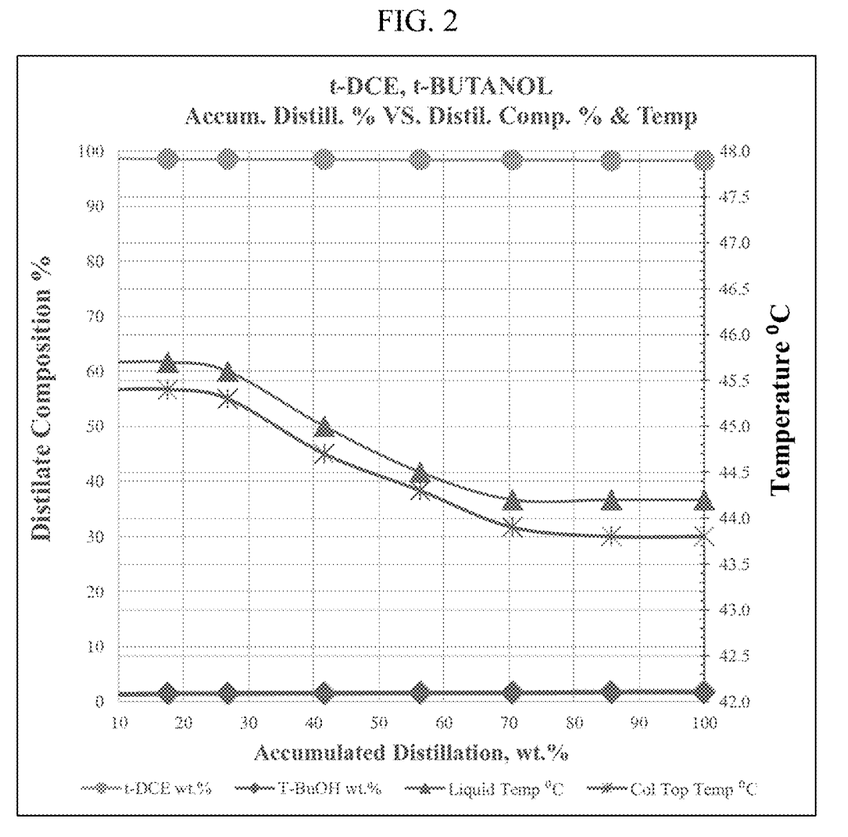
FIG. 2 is a line chart showing the average composition and temperature of successive distillate fractions of a composition of t-DCE and t-butanol.

The same distillation procedure as in Example 1 was performed with t-butanol and t-DCE. The results are shown in Table 4 and FIG. 2.

TABLE 4

| Cut # | Accumulated Distillation % | Liquid Temp ° C. | Col Top Temp ° C. | t-DCE wt. % | t-Butanol wt. % |
|---|---|---|---|---|---|
| 01 | 9.02 | 45.7 | 45.40 | 98.65 | 1.35 |
| 02 | 17.59 | 45.7 | 45.4 | 98.54 | 1.46 |
| 03 | 26.80 | 45.6 | 45.30 | 98.51 | 1.49 |
| 04 | 41.62 | 45.0 | 44.70 | 98.47 | 1.53 |
| 05 | 56.35 | 44.5 | 44.3 | 98.41 | 1.59 |
| 06 | 70.53 | 44.2 | 43.90 | 98.36 | 1.64 |
| 07 | 85.73 | 44.2 | 43.80 | 98.26 | 1.74 |
| 08 | 100.00 | 44.2 | 43.80 | 98.25 | 1.75 |

It can be observed that throughout the distillation, the distillation temperatures and compositions remained relatively constant which indicates azeotropic behavior. On average the composition of 1.6±0.14 weight % acetone and 98.4±0.14 weight % t-DCE was observed.

Example 5

Figure 1:
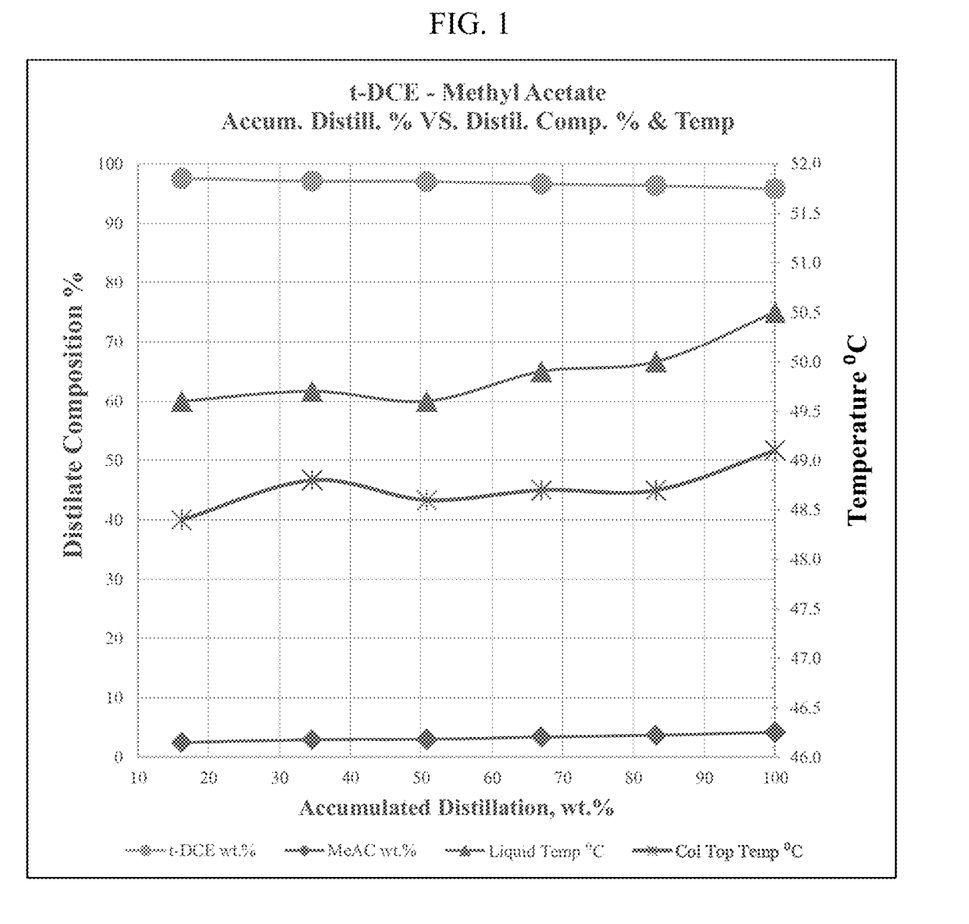
FIG. 1 is a line chart showing the average compositions and temperatures of successive distillate fractions of a composition of t-DCE and methyl acetate.

The same distillation procedure as in Example 1 was performed with methyl acetate and t-DCE. The results are shown in Table 5 and FIG. 1.

TABLE 5

| Cut # | Accumulated Distillation % | Liquid Temp ° C. | Col Top Temp ° C. | t-DCE wt. % | Methyl Acetate wt. % |
|---|---|---|---|---|---|
| 01 | 16.2 | 49.6 | 48.4 | 97.51 | 2.49 |
| 02 | 34.6 | 49.7 | 48.8 | 97.07 | 2.93 |
| 03 | 50.8 | 49.6 | 48.6 | 97.00 | 3.00 |
| 04 | 67.0 | 49.9 | 48.7 | 96.60 | 3.40 |
| 05 | 83.2 | 50.0 | 48.7 | 96.31 | 3.69 |
| 06 | 100.0 | 50.5 | 49.1 | 95.81 | 4.19 |

It can be observed that throughout the distillation that, although the boiling temperatures and the vapor temperatures at the top of the column are higher than the boiling temperature of t-DCE itself, the consistency over a large range of the distillation process indicates a composition, which is behaving like azeotrope.

Examples 6-14

Mixtures of t-DCE with one of methanol, ethanol, 1-propanol, 2-propanol, 2-butanol, t-butanol, acetone, methyl acetate, and hexane were distilled at ambient pressure. The distillate fractions were analyzed to identify whether these mixtures formed a ternary azeotrope, and if so, the composition (% by weight) and boiling point (b.p. ° C.) of the azeotrope, using the same procedures as described above. This procedure was repeated several times for each mixture. Using this procedure, the following azeotrope-like compositions listed in Table 6 were identified. Line charts showing the average compositions and temperatures of successive distillate fractions of compositions comprising t-DCE in combination with methyl acetate, t-butanol, acetone, ethanol, and iso-propanol are also shown in FIGS. 1-5, respectively.

TABLE 6

| Example | Liquid BP ° C. | Col. Top Temp. ° C. | t-DCE wt. % | 2$^{nd}$ Component | wt. % |
|---|---|---|---|---|---|
| 6 | 42.3 | 42.0 | 91.1 | Methanol | 8.9 |
| 7 | 45.0 | 44.5 | 94.2 | Ethanol | 5.8 |
| 8 | 47.5 | 47.1 | 98.5 | n Propanol | 1.5 |
| 9 | 47.3 | 46.7 | 94.5 | Iso-Propanol | 5.5 |
| 10 | 48.2 | 47.9 | 99.2 | 2 Butanol | 0.8 |
| 11 | 44.9 | 44.6 | 98.4 | t Butanol | 1.6 |
| 12 | 47.9 | 47.6 | 95.8 | Acetone | 4.2 |
| 13 | 49.9 | 48.7 | 96.7 | Methyl Acetate | 3.3 |
| 14 | 47.3 | 46.8 | 96.5 | Hexane | 3.5 |

Example 15

A circuit board having dimensions of 3"×4" was coated with S3X48-M270 lead-free solder paste (available from KOKI Company). The solder paste was reflowed at 236° C.

for 4 minutes in a convection oven. The board was then cooled to room temperature. The soldered test board was then immersed for 2 minutes into a boiling mixture containing the azeotrope of Example 2 (t-DCE and ethanol). Upon removal from the mixture, visual inspection of the board indicated that the all of the solder flux residue had been removed, demonstrating the exceptional solvency power of the disclosed compositions.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A solvent composition comprising:
   at least 80 wt. % of trans-1,2-dichloroethylene (t-DCE); and
   to greater than 5 wt. % and less than or equal to 20 wt. % of at least one organic compound,
   wherein:
      the at least one organic compound is flammable by itself;
      the composition is nonflammable;
      the composition comprises less than 0.1 wt. % of halogenated organic compounds other than t-DCE.

2. The solvent composition according to claim 1, wherein the composition comprises less than 0.1 wt. % of one or more halogenated organic compounds selected from the group consisting of heptafluorocyclopentane, perfluoro(2-methyl-2-pentene), E-perfluoro(4-methyl-2-pentene), Z-perfluoro(4-methyl-2-pentene), 1,1,1,4,4,5,5,5-octafluoro-2-pentene, perfluorobutyl methyl ether, perfluorobutyl ethyl ether, perfluoroisopropylmethyl ether, perfluoroethyl isopropyl ketone, E-1,1,1-trifluoro-3-chloro-2-propene, and 1,1,1,3,3-pentafluorobutane.

3. The solvent composition according to claim 1, wherein the composition comprises substantially no halogenated organic compounds other than t-DCE.

4. The solvent composition according to claim 1, wherein the composition consists essentially of the t-DCE and the at least one organic compound.

5. The solvent composition according to claim 1, wherein the at least one organic compound is one or more of a $C_1$ to $C_{10}$ alkane or cycloalkane, a $C_1$ to $C_{10}$ arene, $C_1$ to $C_{10}$ alkene or cycloalkene, a $C_1$ to $C_{10}$ alcohol, a $C_1$ to $C_{10}$ ketone, a $C_1$ to $C_{10}$ aldehyde, a $C_1$ to $C_{10}$ ether, a $C_1$ to $C_{10}$ ester, a $C_1$ to $C_{10}$ carboxylic acid, a $C_1$ to $C_{10}$ nitrile, a $C_1$ to $C_{10}$ nitro compound, and a $C_1$ to $C_{10}$ heterocyclic compound.

6. The solvent composition according to claim 1, wherein the at least one organic compound is selected from the group consisting of methanol, ethanol, n-propanol, iso-propanol, n-butanol, iso-butanol, t-butanol, methyl acetate, ethyl acetate, t-butyl acetate, dimethoxy methane, dimethoxy ethane, dimethoxy propane, acetone, methyl ethyl ketone, methyl isobutyl ketone, nitromethane, dimethylcarbonate, acetic acid, acetonitrile, diethyl ether, ethylene glycol, diethylene glycol, diethylene glycol dimethyl ether, glycerin, methyl t-butyl ether, dimethyl-formamide, pyridine, dimethyl sulfoxide, butyleneoxide, furan, tetrahydrofuran, dioxane, toluene, xylene, pentane, hexane, cyclohexane, octane, pentene, hexene, cyclohexene, heptane, benzene, and combinations thereof.

7. The solvent composition according to claim 1, wherein the composition is a binary azeotrope or azeotrope-like composition comprising one organic compound, or a ternary azeotrope or azeotrope-like composition comprising two organic compounds.

8. The solvent composition according to claim 1, wherein the at least one organic compound is present in an amount in a range of greater than 5 weight percent and less than or equal to 10 wt. %, and the balance is t-DCE.

9. The solvent composition according to claim 1, wherein t-DCE is present in an amount of at least 90 wt. %.

10. The solvent composition according to claim 1, further comprising one or more additives selected from the group consisting of an acid acceptor, metal passivator, stabilizing agent, and surfactant.

11. A foam blowing agent comprising the solvent composition according to claim 1.

12. A method of cleaning a surface comprising:
    contacting the surface with the solvent composition according to claim 1 to dissolve a contaminant on the surface.

13. The method according to claim 12, wherein the surface is contacted with the solvent composition via vapor degreasing, which is performed by:
    heating the solvent composition to vaporize the composition; and
    exposing the surface to vapors of the composition,
    wherein the vapors of the composition condense on the surface during exposure of the surface to the vapors to dissolve a contaminant on the surface.

14. The method according to claim 12, wherein the solvent composition is sprayed onto the surface in the form of a liquid or an aerosol.

15. The method according to claim 12, further comprising brushing or wiping the surface simultaneously with or after contact with the solvent composition to spread or rub the composition on the surface.

16. A method of drycleaning a fabric or fiber, comprising contacting the fabric or fiber with the solvent composition according to claim 1.

17. A method for removing a coating or stripping paint from a surface of a substrate comprising:
    contacting the surface with the solvent composition according to claim 1 to dissolve the coating; and
    removing the composition containing the coating or the paint from the surface.

18. A method for depositing a material on a substrate, comprising:
    dissolving the material in the solvent composition according to claim 1;
    applying the composition containing the material onto the substrate; and
    evaporating the composition from the substrate.

19. The solvent composition according to claim 1, wherein the organic compound is one or more of a $C_1$ to $C_{15}$ alkane or cycloalkane, a $C_1$ to $C_{15}$ arene, a $C_1$ to $C_{12}$ alcohol, a $C_1$ to $C_{12}$ aldehyde, a $C_1$ to $C_{12}$ carboxylic acid, a $C_1$ to $C_5$ nitrile, a $C_1$ to $C_5$ nitro compound, or a $C_1$ to $C_7$ heterocyclic compound.

* * * * *